(12) United States Patent
Sutardja et al.

(10) Patent No.: US 6,839,015 B1
(45) Date of Patent: Jan. 4, 2005

(54) LOW POWER ANALOG TO DIGITAL CONVERTER

(75) Inventors: Sehat Sutardja, Los Altos Hills, CA (US); Farbod Aram, Cupertino, CA (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 10/313,369

(22) Filed: Dec. 6, 2002

(51) Int. Cl.[7] ............................. H03M 1/38; H03M 1/12
(52) U.S. Cl. ................................. 341/161; 341/172
(58) Field of Search ........................... 341/161, 172, 341/155, 122, 142, 143, 135; 330/254; 331/17; 323/282; 327/541

(56) References Cited

U.S. PATENT DOCUMENTS

| | | | | |
|---|---|---|---|---|
| 5,294,928 A | | 3/1994 | Cooper et al. | 341/142 |
| 5,841,383 A | * | 11/1998 | Regier | 341/122 |
| 5,914,681 A | | 6/1999 | Rundel | 341/135 |
| 6,037,891 A | | 3/2000 | Griph | 341/161 |
| 6,057,795 A | | 5/2000 | Suzuki | 341/155 |
| 6,107,889 A | * | 8/2000 | Strange et al. | 331/17 |
| 6,369,554 B1 | | 4/2002 | Aram | 323/282 |
| 6,396,334 B1 | | 5/2002 | Aram | 327/541 |
| 6,400,214 B1 | | 6/2002 | Aram et al. | 327/541 |
| 6,441,765 B1 | | 8/2002 | Aram | 341/155 |
| 6,462,695 B1 | * | 10/2002 | Ahuja et al. | 341/161 |
| 6,501,411 B2 | * | 12/2002 | Soundarapandian et al. | 341/161 |
| 6,535,061 B2 | * | 3/2003 | Darmawaskita et al. | 330/254 |
| 6,552,676 B1 | * | 4/2003 | Bjorksten et al. | 341/143 |

* cited by examiner

*Primary Examiner*—Patrick Wamsley

(57) ABSTRACT

An analog to digital converter includes a first charging circuit that samples an input voltage during a charging phase. A first opamp has an input that communicates with the first charging circuit during an integrating phase. A first current source selectively generates a first bias current for the first opamp during the charging phase and a second bias current that is not equal to the first bias current during the integrating phase. The first bias current is less than the second bias current. The first current source can be a variable current source that selectively provides the first and second bias currents during the charging and integrating phases, respectively. Alternately, the first current source can include two current sources. Only one of the two current sources is connected to the first opamp during the integrating phase.

53 Claims, 12 Drawing Sheets

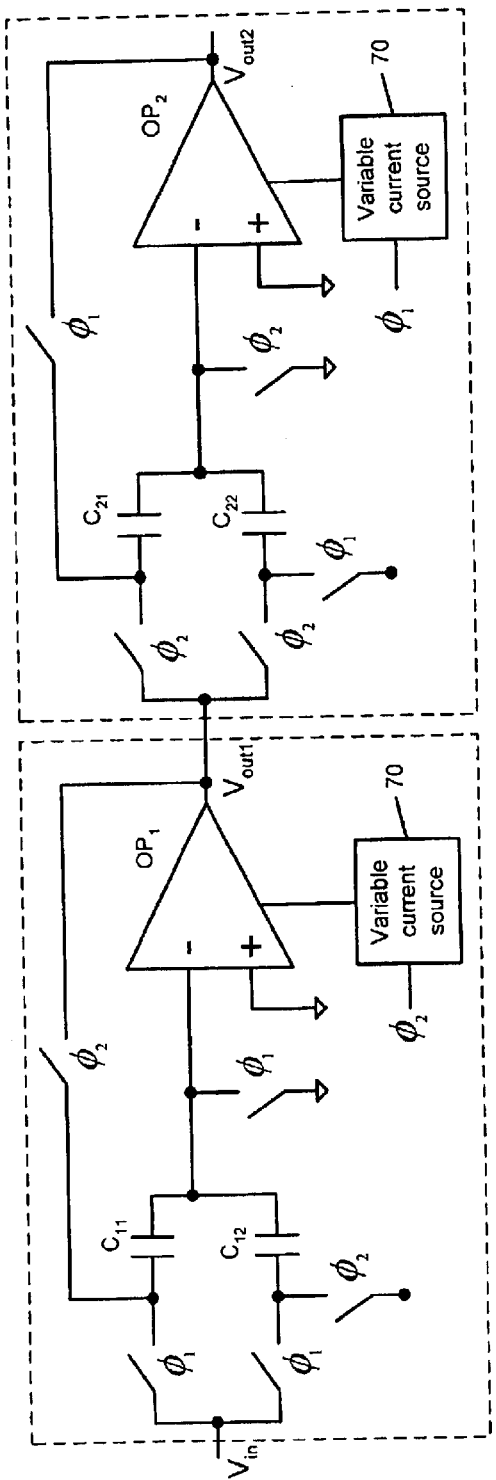
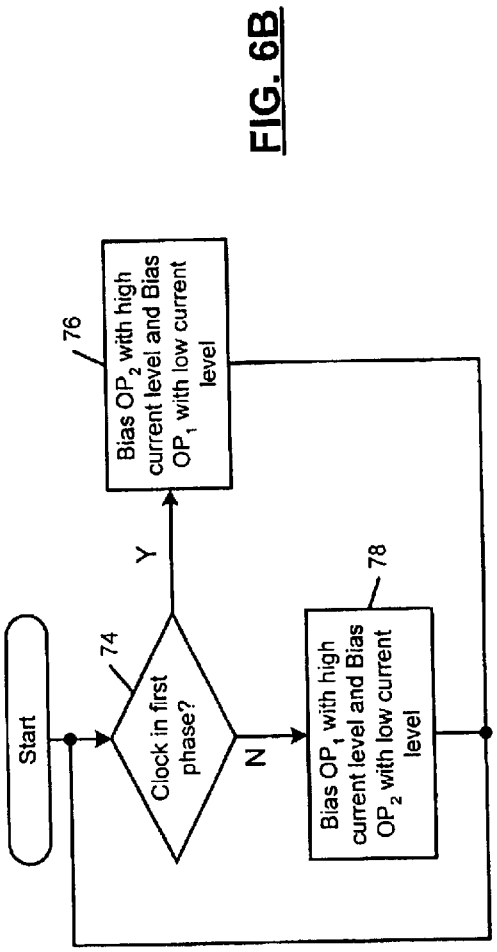
FIG. 6A
FIG. 6B

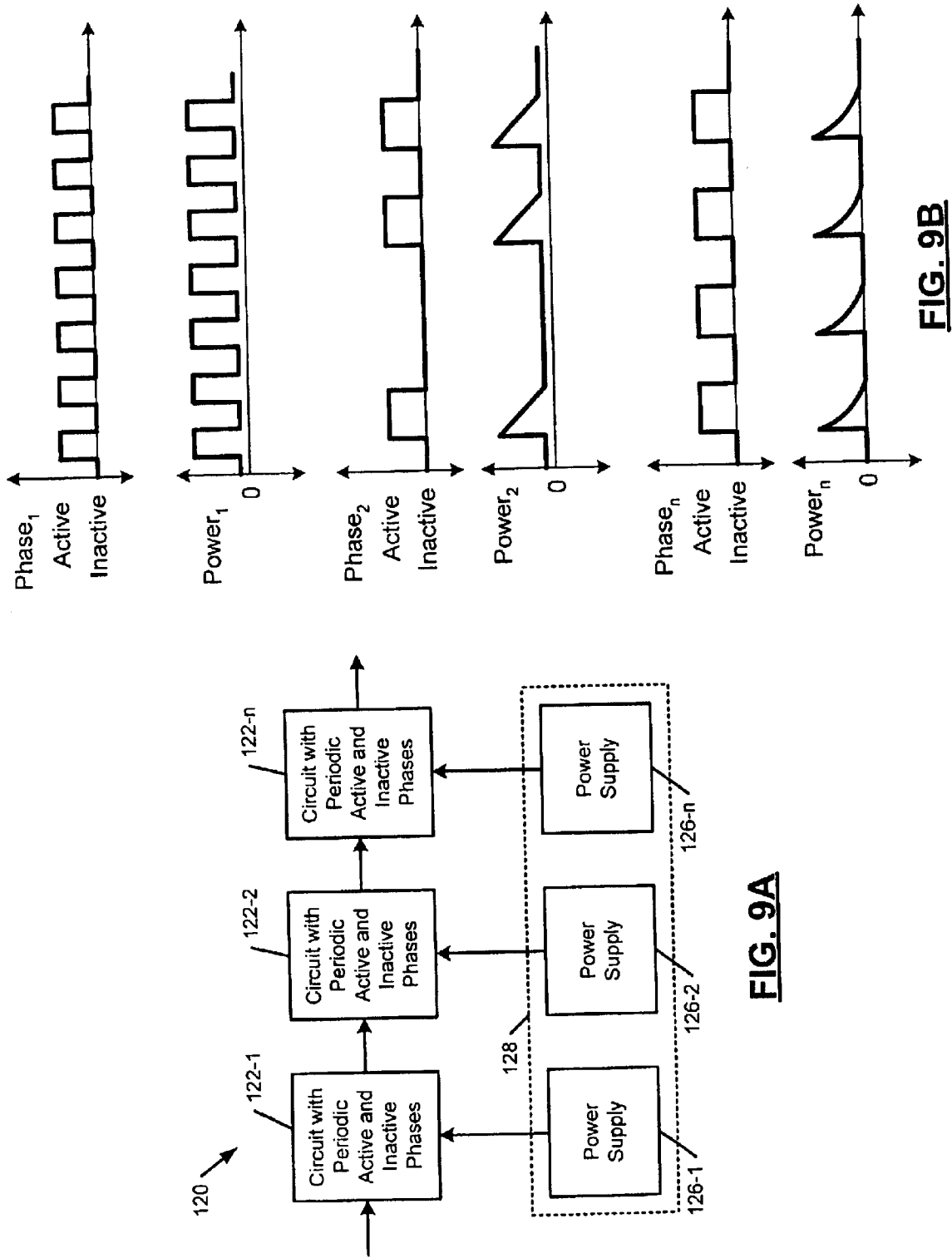

LOW POWER ANALOG TO DIGITAL CONVERTER

FIELD OF THE INVENTION

The present invention relates to a multi-stage pipelined analog to digital converter, and more particularly to a method for reducing power consumption of each stage of an analog to digital converter.

BACKGROUND OF THE INVENTION

Multi-stage pipelined analog to digital converters (ADC) provide efficient high speed conversion of analog signals to digital equivalents. A representative multi-stage pipelined ADC 10 is shown in FIG. 1. The ADC 10 generally includes a plurality of converter stages, such as stages 11, 12 and 13, arranged in series relative to each other. Each converter stage operates by comparing an analog input voltage to thresholds provided by reference signals Vretp and Vrefn. As a result, each converter stage provides one or more bits of digital data to a digital correction circuit 15. The digital correction circuit 15, in turn, resolves the digital output from each stage into a digital output 16 that corresponds to an analog input 17.

FIG. 2 is a generalized block diagram of each converter stage. In operation, each stage accepts an analog input voltage and generates a residual analog voltage and a digital stage output. In particular, each stage applies the analog input voltage to a multiplying digital to analog converter (MDAC) 19 to generate the residual analog voltage. The residual analog voltage is then provided to a comparator 18, which generates the digital stage output. The residual analog voltage also serves as input to subsequent converter stages. This arrangement is also referred to herein as a bit-and-one-half analog to digital converter.

Each converter stage may include a switched capacitor circuit as shown in FIG. 3. The switched capacitor circuit operates in accordance with a two cycle clock with phases designated as $\phi_1$ and $\phi_2$. During a sampling phase, input capacitors $C_1$ and $C_2$ are charged by an input voltage $V_{in}$. In this phase, an operational amplifier 21 does not perform a function. During a subsequent integration phase, the switched capacitor circuit generates a residual output voltage. More specifically, the charge stored by the input capacitors is integrated by the operational amplifier 21 to generate an output voltage $V_{out}$. In other words, the operational amplifier 21 is active every other clock cycle. The same bias current is continuously supplied to the operational amplifier 21.

SUMMARY OF THE INVENTION

An analog to digital converter includes a first charging circuit that is selectively charged by an input voltage. A first opamp has one input that selectively communicates with the first charging circuit. A first current source selectively generates a first bias current for the first opamp during a first phase and a second bias current that is not equal to the first bias current for the first opamp during a second phase.

In other features, the first bias current is less than the second bias current. The first bias current is zero and the second bias current is greater than zero. The first opamp is operated in an integrating mode during the second phase.

In still other features, a first switching circuit communicates with the one input of the first opamp, the first charging circuit and the first current source. The first switching circuit charges the first charging circuit using the input voltage and operates the first current source to supply the first bias current to the first opamp during the first phase. The first switching circuit isolates the first charging circuit from the input voltage, operates the first opamp in an integrating mode and operates the first current source to supply the second bias current to the first opamp during the second phase.

In still other features, the first current source is a variable current source that selectively provides the first and second bias currents during the first and second phases, respectively. Alternately, the first current source includes two current sources. Only one of the two current sources is connected to the first opamp during the second phase.

In yet other features, a second charging circuit is selectively charged by an output of the first opamp. A second opamp has one input that selectively communicates with the second charging circuit. A second current source selectively generates the second bias current for the second opamp during the first phase and the first bias current for the second opamp during the second phase.

In still other features, a second switching circuit communicates with the one input of the second opamp, the second charging circuit and the second current source. The second switching circuit charges the second charging circuit using the output of the second opamp, operates the second opamp in an integrating mode and operates the second current source to supply the second bias current to the second opamp during the first phase. The second switching circuit isolates the second charging circuit from the output of the first opamp and operates the second current source to supply the first bias current to the second opamp during the second phase. The first charging circuit includes at least one capacitor.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 6A is a diagram of a second switched capacitor circuit with reduced power consumption in accordance with the present invention;

FIG. 6B is a flowchart illustrating the operation of the circuit in FIG. 6A;

FIG. 9A illustrates multiple circuits having regular and/or irregular periodic active and inactive phases during operation and one or more power supplies that supply first and second bias signals during the regular and/or irregular periodic active and inactive phases, respectively;

FIG. 9B illustrates exemplary regular and/or irregular periodic active and inactive phases for each of the circuits in FIG. 9A and exemplary first and second bias signals during the regular and/or irregular periodic active and inactive phases, respectively;

DETAILED DESCRIPTION OF THE PREFERRED EMBODIMENTS

Figure 1:
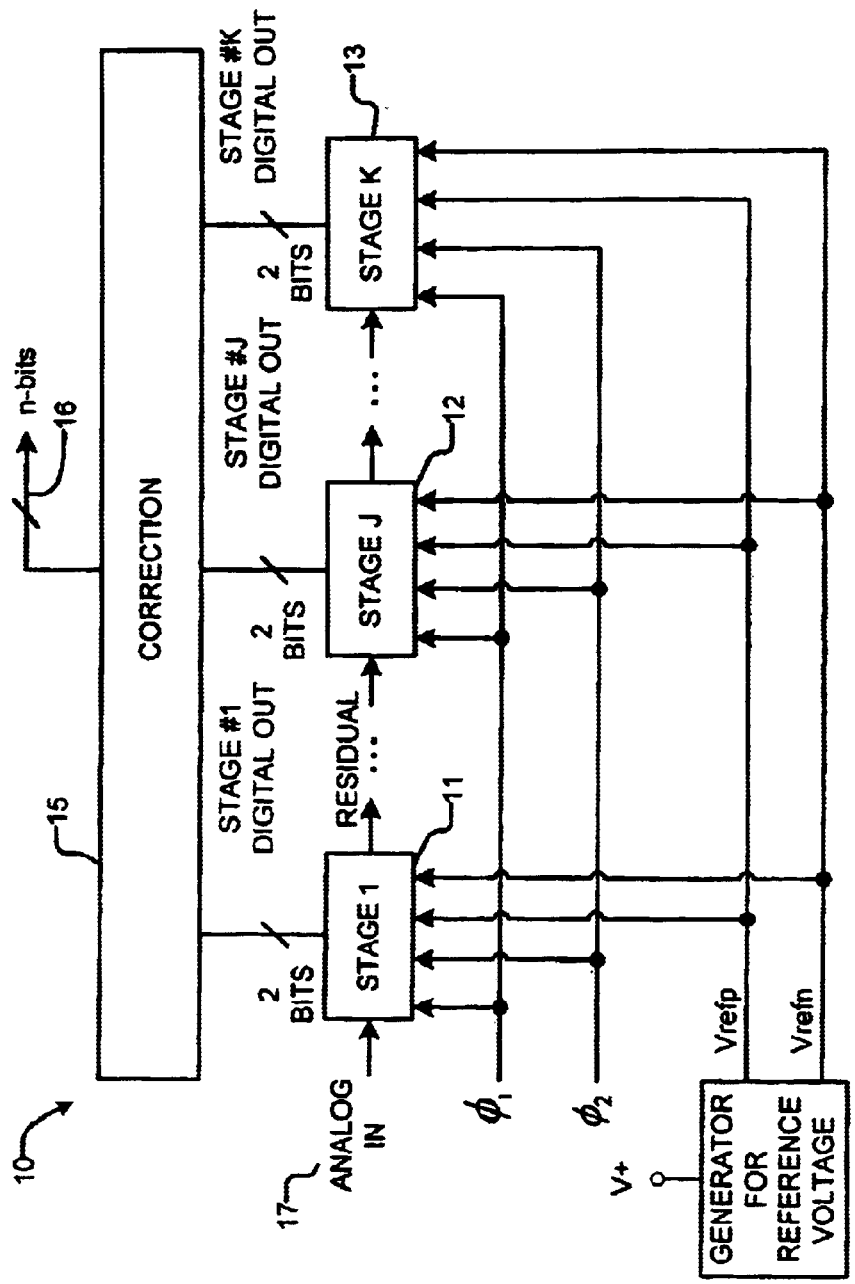
FIG. 1 is a block diagram depicting a conventional multi-stage pipelined analog to digital converter (ADC) according to the prior art.
Figure 2:
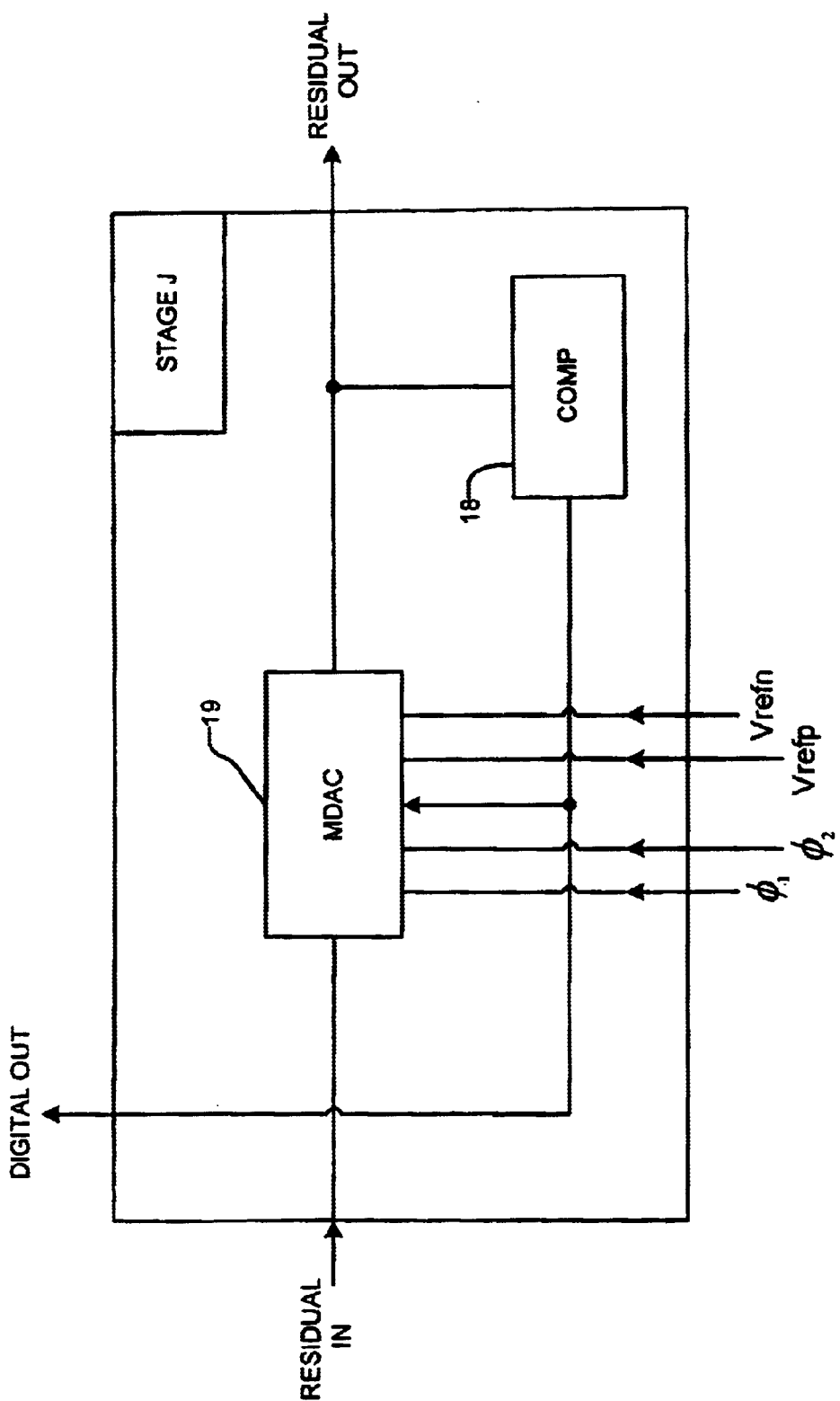
FIG. 2 is a block diagram an exemplary converter stage residing in the multi-stage ADC according to the prior art.
Figure 3:
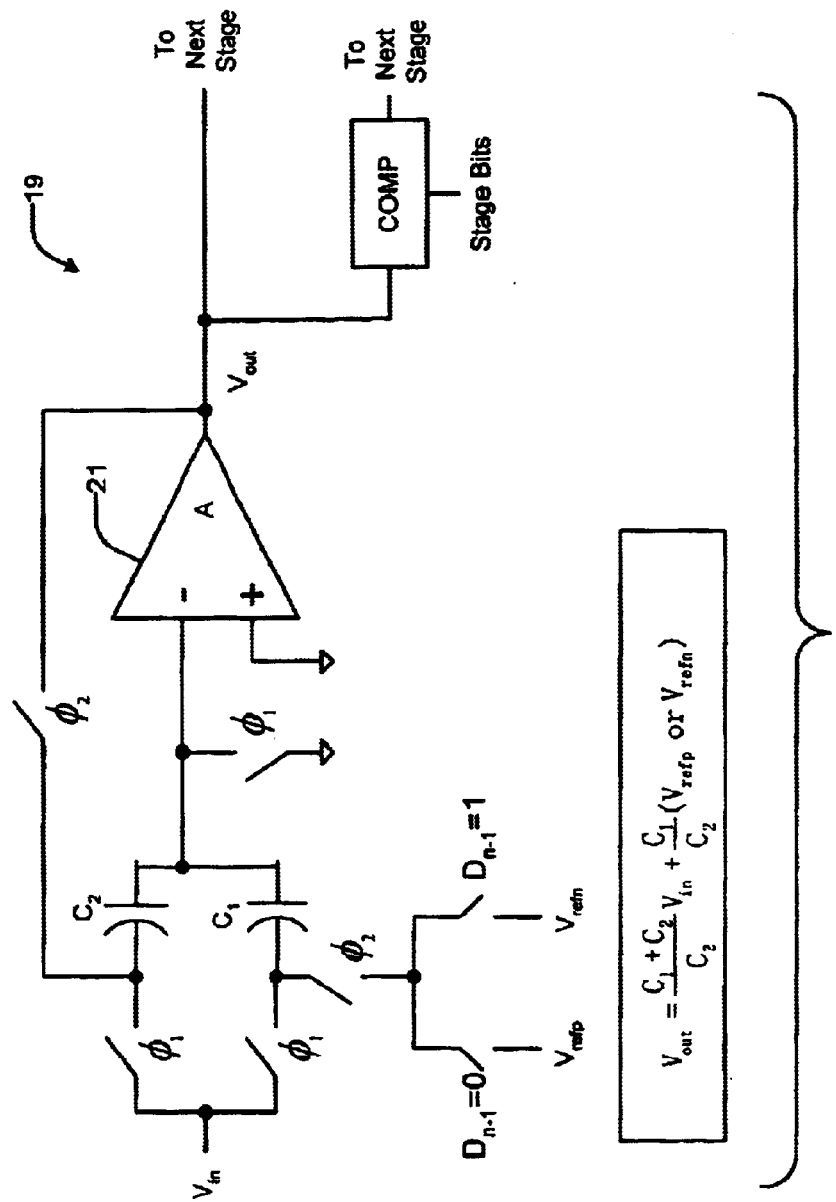
FIG. 3 is a block diagram of a conventional switched capacitor circuit which may be implemented in a converter stage of the multi-stage ADC according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 4A:
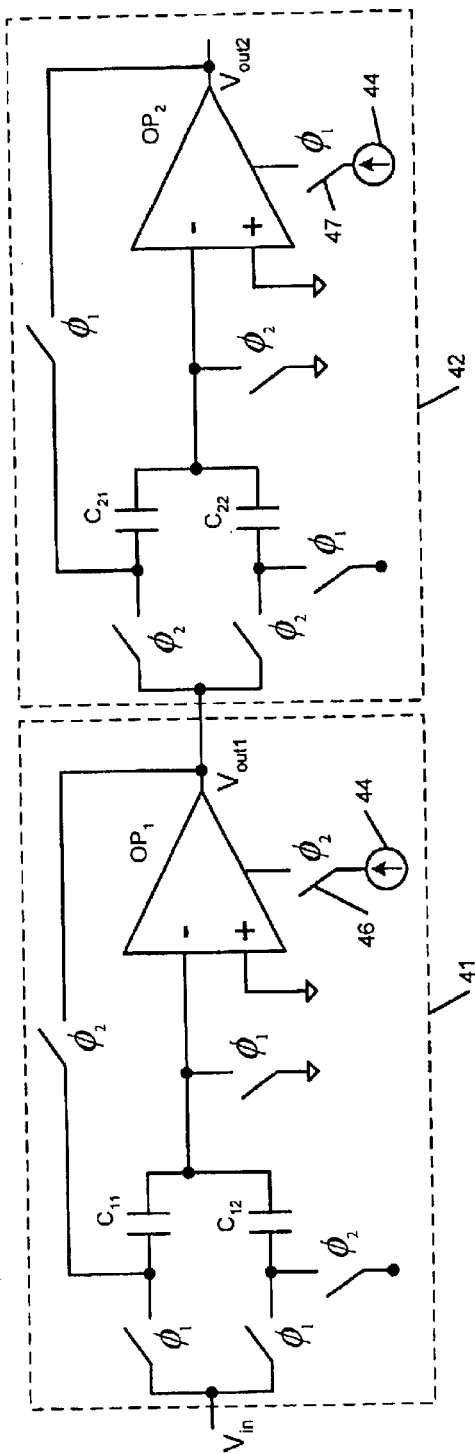
FIG. 4A is a block diagram of a first switched capacitor circuit with reduced power consumption in accordance with the present invention.

Referring now to FIG. 4A, a partial schematic of two exemplary converter stages 41, 42 of a multi-stage pipelined analog to digital converter are shown. For simplicity only two stages are shown; however, it is readily understood that an analog to digital converter may employ more converter stages. For instance, a nine bit analog to digital converter employs seven such converter stages. Moreover, it is readily understood that the operational schemes of the present invention are applicable to such converters.

Each converter stage includes a switched capacitor circuit and a comparator. As noted above, each switched capacitor circuit operates in accordance with a two cycle clock. During a first clock cycle, switches designated $\phi_1$ are closed and switches designated $\phi_2$ are open; whereas, during a second clock cycle, switches $\phi_1$ are open and switches $\phi_2$ are closed.

During the first clock cycle, input capacitors $C_{11}$, $C_{12}$ of the first stage 41 are charged by an input voltage $V_{in}$. This process is also referred to herein as the sampling phase. Concurrently, the charged stored (from a previous clock cycle) in the input capacitors $C_{21}$, $C_{22}$ of the second stage 42 is integrated by the operational amplifier $OP_2$ of the second stage 42 to generate a residual output voltage $V_{out2}$. This residual output voltage $V_{out2}$ is based on reference voltages as well as digital output from the comparator. This process is also referred to herein as the integration phase. It should be noted that the operational amplifier $OP_1$ of the first stage 41 is not active during this clock cycle.

Conversely, during the second clock cycle, input capacitors $C_{21}$, $C_{22}$ of the second stage 42 are charged by an input voltage $V_{out1}$; whereas, the charged stored in the input capacitors $C_{11}$, $C_{12}$ of the first stage 41 is integrated by the operational amplifier $OP_1$ of the first stage 41 to generate a residual output voltage $V_{out1}$. The residual output voltage $V_{out1}$ from the first stage serves as the input voltage to the second stage as shown in FIG. 4A.

Figure 4B:
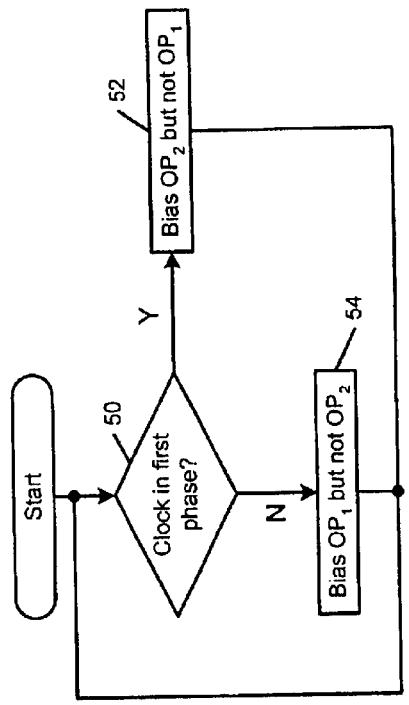
FIG. 4B is a flowchart illustrating the operation of the circuit in FIG. 4A.

In accordance with the present invention, each operational amplifier is only biased during the integration phase to reduce power consumption. Referring to FIGS. 4A and 4B, a current source 44 may be electrically connected to each of the operational amplifiers $OP_1$, $OP_2$. In addition, switching elements 46, 47 may be located between the current source 44 and each of the operational amplifiers $OP_1$, $OP_2$. During the first clock cycle or phase (as determined in step 50), a bias current is supplied to the operational amplifier $OP_2$ of the second stage 42, but not to the operational amplifier $OP_1$ of the first stage 41 (as shown in step 52). Conversely, during the second clock cycle, a bias current is supplied to the operational amplifier $OP_1$ of the first stage 41, but not to the operational amplifier $OP_2$ of the second stage 42 (as shown in step 52). In other words, each operational amplifier is biased only during its active phase, thereby reducing the power consumption of the circuit.

Figure 5B:
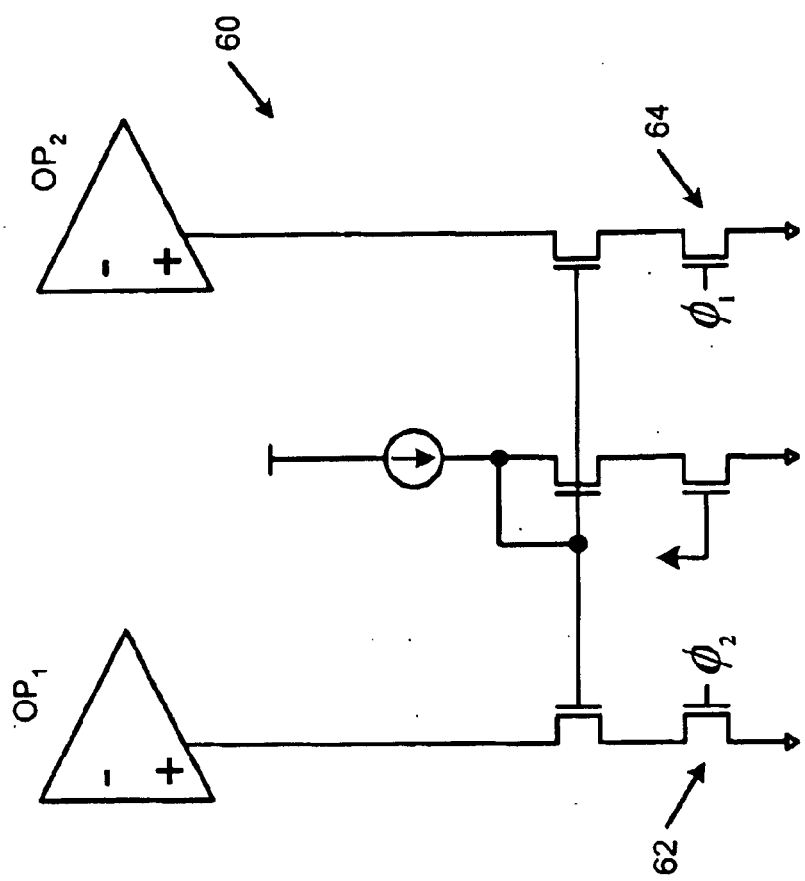
FIG. 5B illustrates biasing of first and second operational amplifiers using a shared current source between adjacent stages according to the present invention.
Figure 5A:
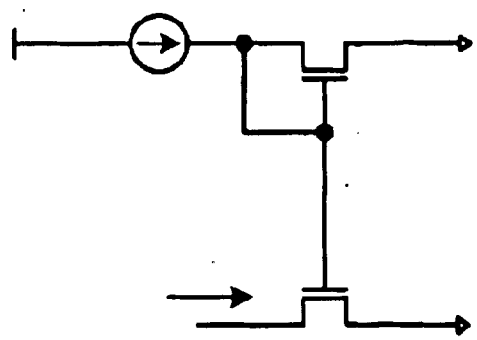
FIG. 5A illustrates a current mirror according to the prior art.

An exemplary circuit for biasing the operational amplifiers is depicted in FIGS. 5A and 5B. In particular, a biasing circuit 60 employs a current mirror configuration (as shown in FIG. 5A) as is well known in the art. Referring now to FIG. 5B, in operation, transistors 62, 64 serve as switching elements, which control when a bias current is applied to a given operational amplifier. However, it is readily understood that other circuit configurations for biasing the operational amplifiers are within the broader aspects of the present invention.

Figure 7A:
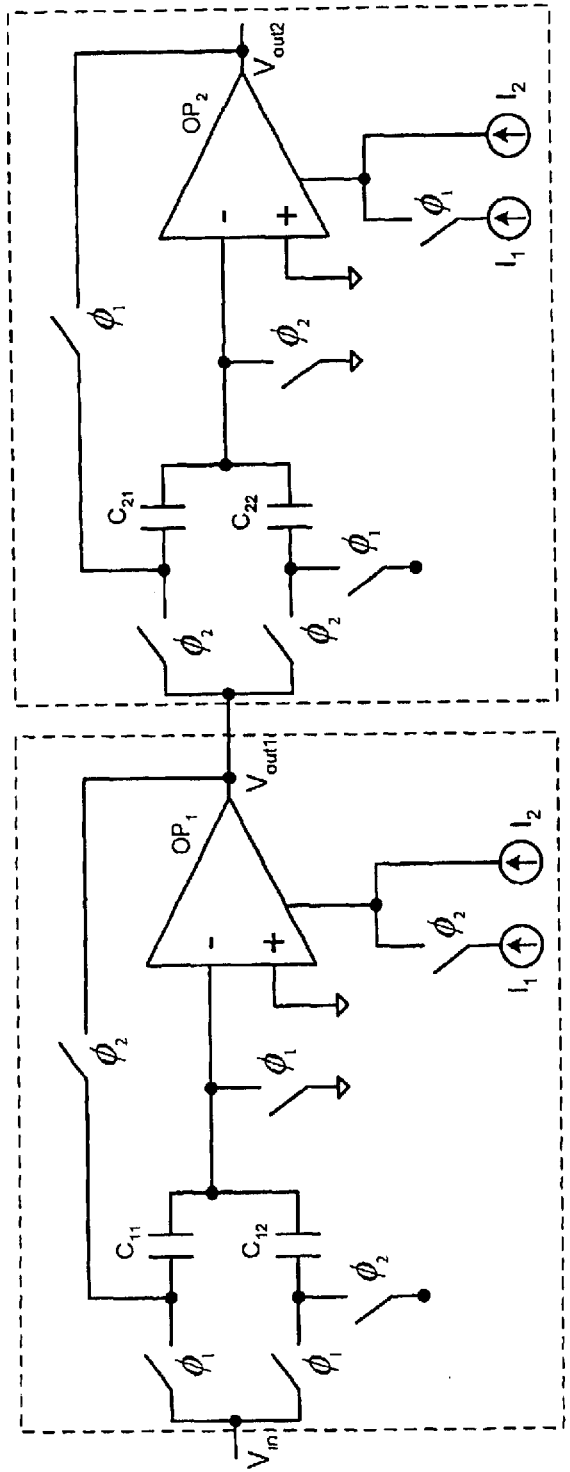
FIG. 7A is a diagram of a third switched capacitor circuit with reduced power consumption in accordance with the present invention.

In alternate embodiments depicted in FIGS. 6A and 7A, a fractional portion of the bias current may be supplied to each of the operational amplifiers during the sampling phase. In other words, each operational amplifier is supplied with a full bias current during its integration phase and with a fractional portion of the full bias current during its sampling phase. Although not limited thereto, the fractional biasing current can be 25% of the full bias current. By supplying a fractional portion of bias current, the operational amplifiers are able to maintain a common mode state during the sampling phase. The present invention reduces power consumption of the circuit while maintaining the response of the operational amplifier residing therein.

Referring to FIGS. 6A and 6B, variable current sources 70 may be electrically connected to each of the operational amplifiers $OP_1$, $OP_2$. During the first clock cycle or phase (as determined in step 74), the variable current source 70 of the second stage provides a bias current having a high level to the operational amplifier $OP_2$ of the second stage 42 (as shown in step 76). The variable current source of the first stage provides a low bias current to the operational amplifier $OP_1$ of the first stage 41 (as shown in step 76).

During the second clock cycle or phase (as determined in step 74), the variable current source 70 provides a bias current having a high level to the operational amplifier $OP_1$ of the first stage 42 (as shown in step 78). The variable current sources 70 provide a low bias current to the operational amplifier $OP_2$ of the second stage 41 (as shown in step 78). In other words, one operational amplifier is biased by a high current level during its active phase and the other operational amplifier is biased by a low current level during its inactive phase, and vice-versa, to reduce the power consumption of the circuit.

The variable current sources 70 may receive clock information such as a clock signal, $\phi_1$ and/or $\phi_2$ as an input. In FIG. 6A, the variable current source 70 of the first stage receives $\phi_2$ and the variable current source of the second stage receives $\phi_1$. As can be appreciated, the variable current sources may receive other signals that will allow the variable current source to determine when the associated stage is active or inactive.

Figure 7B:
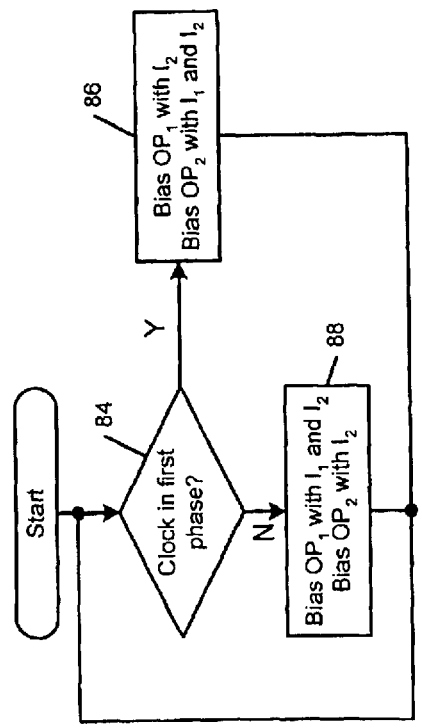
FIG. 7B is a flowchart illustrating the operation of the circuit in FIG. 7A.

Referring to FIGS. 7A and 7B, two current sources $I_1$, and $I_2$ may be selectively connected to each of the operational amplifiers $OP_1$, $OP_2$ depending upon the active/inactive phase of the stage. One of the two current sources is associated with a switch that closes during the active stage and opens during the inactive stage. During the first clock cycle or phase (as determined in step 84), the operational amplifier $OP_2$ of the second stage 42 (as shown in step 86) is biased by both current sources $I_1$ and $I_2$. The operational amplifier $OP_1$ of the first stage 41 (as shown in step 86) is biased by one current source $I_2$.

During the second clock cycle or phase (as determined in step 84), the operational amplifier $OP_2$ of the second stage 42 (as shown in step 76) is biased by one current source $I_2$. The operational amplifier $OP_1$ of the first stage 41 (as shown in step 76) is biased by both current sources $I_1$ and $I_2$. In other words, one operational amplifier is biased by a high current level during its active phase and the other operational amplifier is biased by a low current level during its inactive phase, and vice-versa, to reduce the power consumption of the circuit.

Figure 8B:
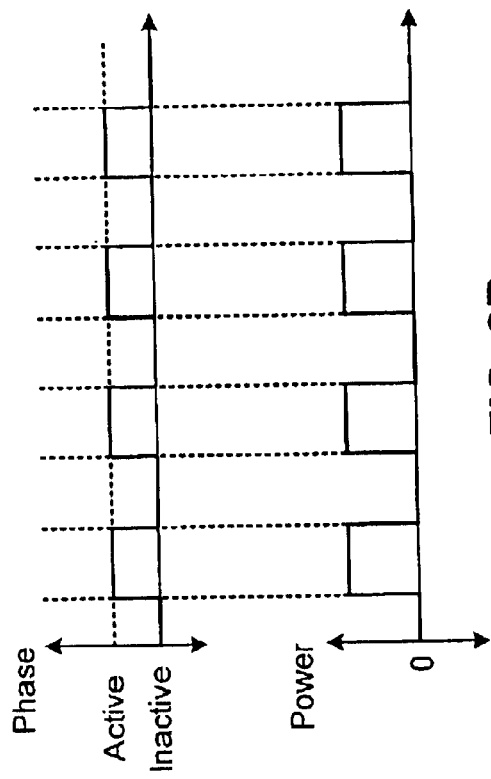
FIG. 8B illustrates exemplary regular periodic active and inactive phases for the circuit in FIG. 8A and exemplary first and second bias signals during the regular periodic active and inactive phases, respectively.
Figure 8C:
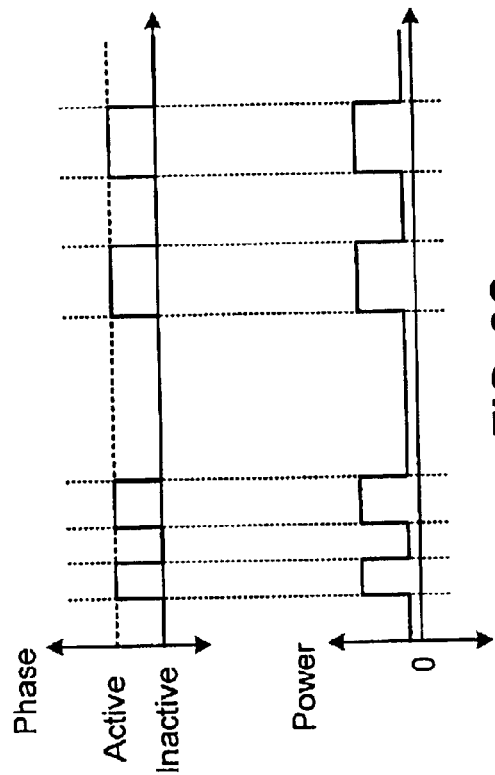
FIG. 8C illustrates exemplary irregular periodic active and inactive phases for the circuit in FIG. 8A and exemplary first and second bias signals during the irregular periodic active and inactive phases, respectively.
Figure 8A:
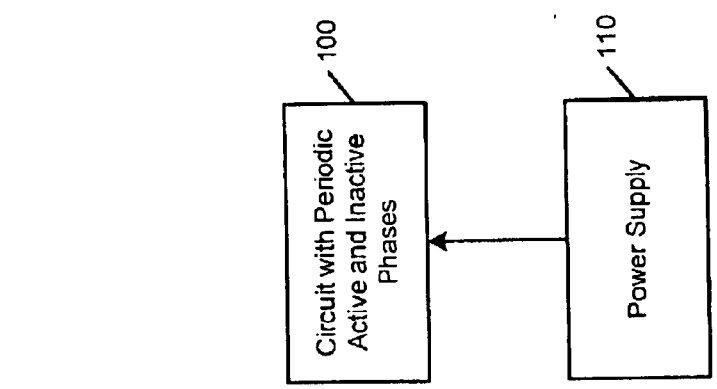
FIG. 8A illustrates a circuit having regular and/or irregular periodic active and inactive phases during operation and a power supply that supplies first and second bias signals during the regular and/or irregular periodic active and inactive phases, respectively.

Referring now to FIG. 8A, a circuit 100 having active and inactive phases during operation is shown. The active and inactive phases can be regularly periodic, or in other words, alternating at regular intervals. Alternately, the active and inactive phases can be irregularly periodic, or in other words, alternating between active and inactive phases at different intervals. A power supply 110 supplies first and second bias signals during the regular and/or irregular periodic active and inactive phases of the circuit 100, respectively. The second bias signal is lower than the first bias signal to reduce power consumption. The second bias signal can be lower during the inactive phase because the inactive phase occurs after an active phase. The circuit has already settled during the active state and is operating in steady state. When the circuit transitions to the inactive state, the circuit needs less power to operate.

The circuit 100 may provide phase feedback information to the power supply 110 if needed. The power supply 110 can be a current source such as those described above, a voltage source or any other suitable power supply. The power supply 110 can include two power supplies that are switched in a manner similar to current sources shown above in FIG. 7A or a variable or multiple output power supply similar to the variable current sources shown in FIG. 6A. Example circuits 100 include switched capacitor filters such as those described in U.S. Pat. No. 6,400,214, filed Aug. 28, 2000 to Aram et al., which is hereby incorporated by reference in its entirety and digital to analog converters such as those described above.

Referring now to FIG. 8B, exemplary regular periodic active and inactive phases for the circuit in FIG. 8A are shown. The power supply 110 generates first and second bias signals during the regular periodic active and inactive phases, respectively. Referring now to FIG. 8C, exemplary irregular periodic active and inactive phases for the circuit in FIG. 8A are shown. The power supply 110 provides first and second bias signals during the irregular periodic active and inactive phases, respectively.

FIG. 9A illustrates a circuit 120 including multiple sub-circuits 122-1, 122-2, ..., and 122-n having active and inactive phases during operation. The active and inactive phases of the sub-circuits 122-1, 122-2, ..., and 122-n may be in-phase and/or out-of-phase with respect to one another. The active and inactive phases may be regular and/or irregular periodic. One or more power supplies 126-1, 126-2, ..., and 126-n supply the first and second bias signals during the active and inactive phases, respectively. A single power supply 128 with multiple outputs may be used to provide outputs to each stage of the circuit 120. The circuit 120 and/or the sub-circuits 122-1, 122-2, ..., and 122-n may provide phase feedback signals to the power supplies 126-1, 126-2, ..., and 126-n if needed. Interconnections between the sub-circuits 126 may be varied from those shown. The circuit 120 may or may not be pipelined.

Referring now to FIGS. 10A–14B, exemplary first and second bias signals are shown that can be used to bias the circuits shown in FIGS. 1–9. Generally, the first bias signals occur during the active phase and have a signal level that is higher than the second bias signal that occurs during the inactive phase. The first and second bias signals can be regular or irregular periodic. The first and/or second signals can also be square-waveform or constant signals, stepped signals, linearly changing signals and/or non-linearly changing signals.

Figure 10A:
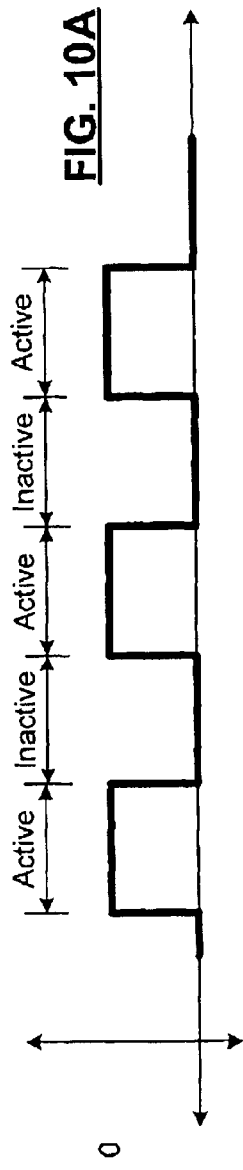
FIG. 10A illustrates a square-waveform bias signal and a zero bias signal for the active and inactive phases, respectively.
Figure 10B:
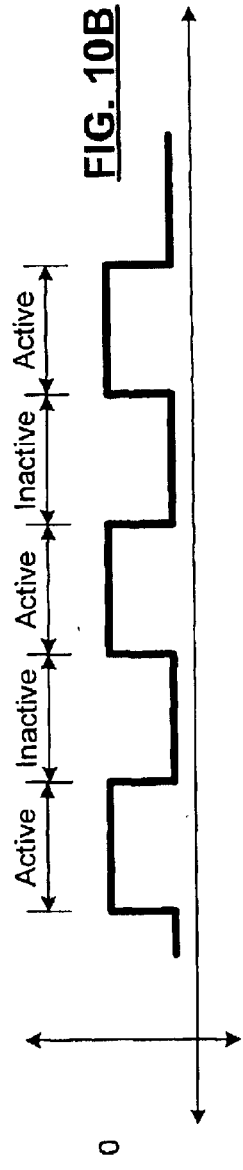
FIG. 10B illustrates the square-waveform bias signal of FIG. 10A and a non-zero bias signal for the active and inactive phases, respectively.

Referring now to FIGS. 10A and 10B, exemplary constant signals are shown. FIG. 10A illustrates a square-waveform bias signal and a zero bias signal for the active and inactive phases, respectively. FIG. 10B illustrates the square-waveform bias signal of FIG. 10A and a non-zero bias signal for the active and inactive phases, respectively.

Figure 11A:
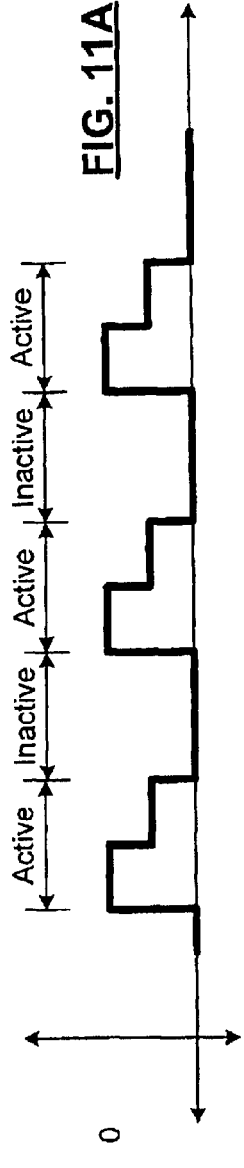
FIG. 11A illustrates a stepped bias signal and a zero bias signal for the active and inactive phases, respectively.
Figure 11B:
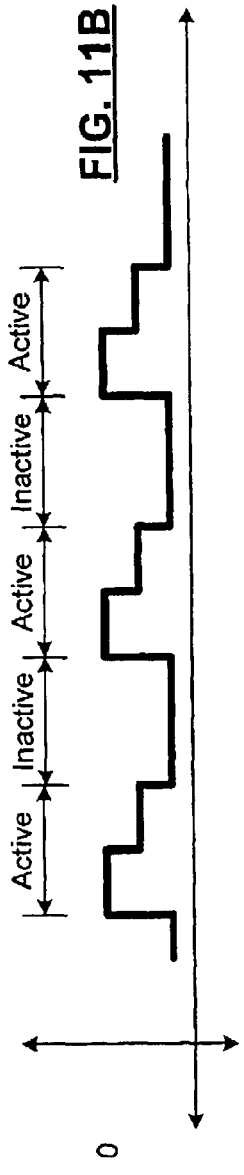
FIG. 11B illustrates the stepped bias signal of FIG. 11A and a non-zero bias signal for the active and inactive phases, respectively.

Referring now to FIGS. 11A and 11B, exemplary stepped signals are shown. FIG. 11A illustrates a stepped bias signal and a zero bias signal for the active and inactive phases, respectively. The stepped bias signal may include a high startup level followed by a lower steady-state level. FIG. 11B illustrates the stepped bias signal of FIG. 11A and a non-zero bias signal for the active and inactive phases, respectively.

Figure 12A:
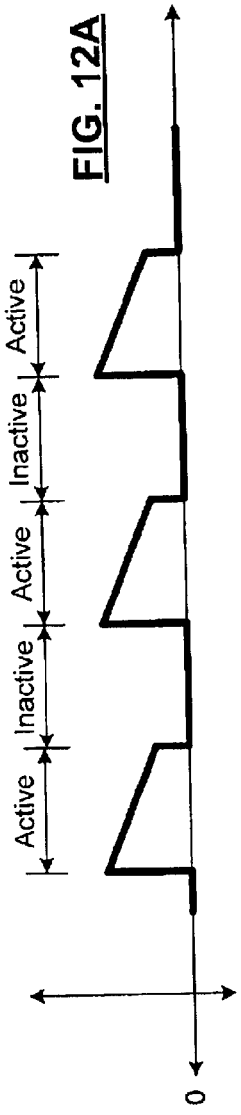
FIG. 12A illustrates a linearly changing bias signal and a zero bias signal for the active and inactive phases, respectively.
Figure 12B:
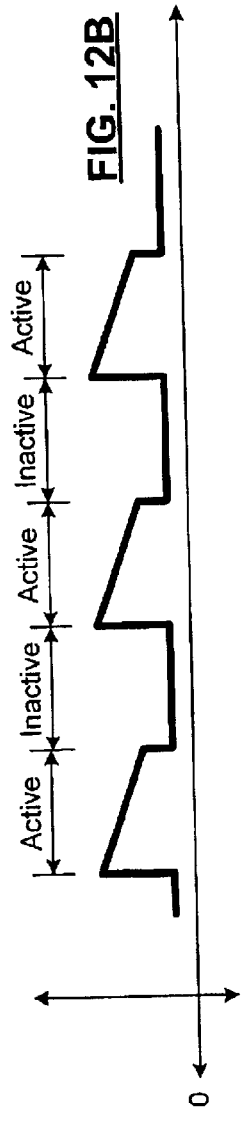
FIG. 12B illustrates the linearly changing bias signal of FIG. 12A and a non-zero bias signal for the active and inactive phases, respectively.

Referring now to FIGS. 12A and 12B, exemplary linearly changing signals are shown. FIG. 12A illustrates a linearly changing bias signal and a zero bias signal for the active and inactive phases, respectively. FIG. 12B illustrates the linearly changing bias signal of FIG. 12A and a non-zero bias signal for the active and inactive phases, respectively.

Figure 13A:
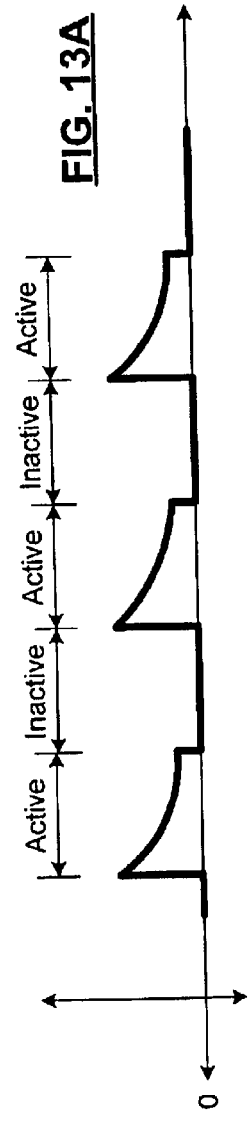
FIG. 13A illustrates an exponentially changing bias signal and a zero bias signal for the active and inactive phases, respectively.
Figure 13B:
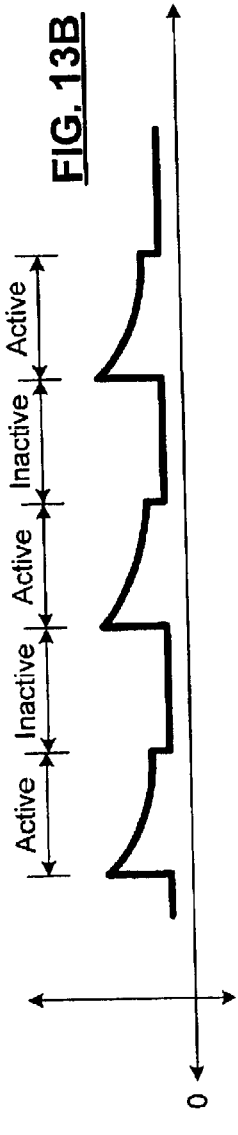
FIG. 13B illustrates the exponentially changing bias signal of FIG. 13A and a non-zero bias signal for the active and inactive phases, respectively.

Referring now to FIGS. 13A and 13B, exemplary non-linearly changing signals are shown. FIG. 13A illustrates an exponential bias signal and a zero bias signal for the active and inactive phases, respectively. FIG. 13B illustrates the exponential bias signal of FIG. 13A and a non-zero bias signal for the active and inactive phases, respectively.

Figure 14A:
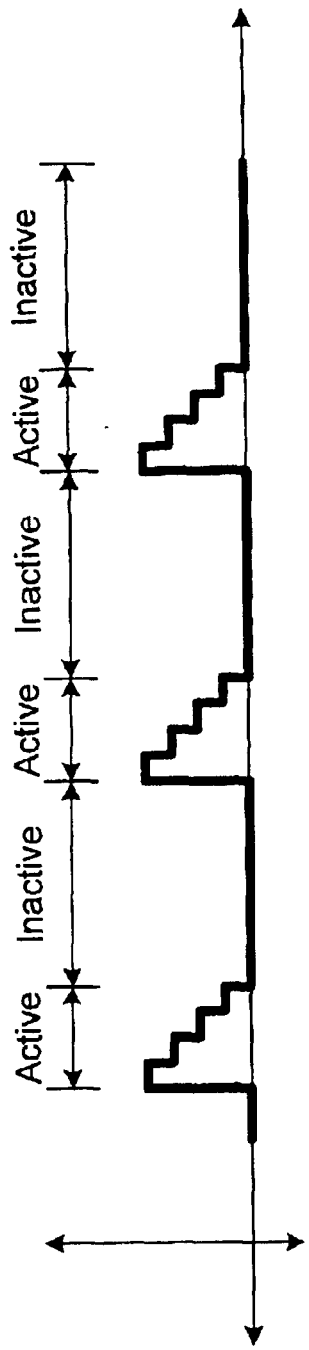
FIG. 14A illustrates a stair-stepped bias signal and a zero bias signal for the active and inactive phases, respectively.
Figure 14B:
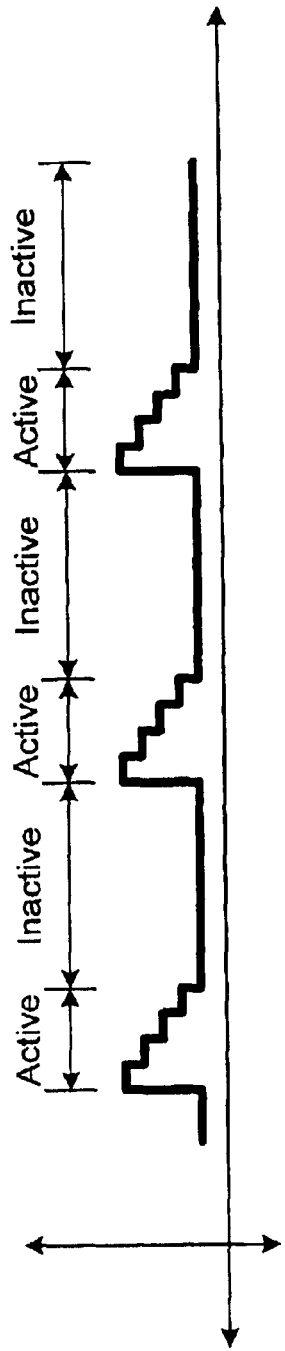
FIG. 14B illustrates the stair-stepped bias signal of FIG. 14A and a non-zero bias signal for the active and inactive phases, respectively.

Referring now to FIGS. 14A and 14B, other exemplary non-linearly changing signals are shown. FIG. 14A illustrates a stair-stepped bias signal and a zero bias signal for the active and inactive phases, respectively. FIG. 14B illustrates the stair-stepped bias signal of FIG. 14A and a non-zero bias signal for the active and inactive phases, respectively.

As can be appreciated by skilled artisans, the present invention significantly reduces power consumption for devices having active and inactive periods. In addition, skilled artisans will appreciate that other bias waveforms can be used for the active and inactive phases in addition to those examples shown in FIGS. 10A–14B. Furthermore, the active and inactive phases need not have the same periods, for example as shown in FIGS. 14A and 14B. The duration of the active and/or inactive period may also vary from one active phase and/or inactive phase to another. While the first bias waveforms in FIGS. 11A–14B are increasing waveforms, decreasing waveforms can also be used.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An analog to digital converter, comprising:
   a first charging circuit that samples an input voltage during a charging phase;
   a first opamp having an input that communicates with said first charging circuit during an integrating phase;
   a first current source that selectively generates a first bias current for said first opamp during said charging phase and a second bias current that is not equal to said first bias current during said integrating phase;
   a second charging circuit that is charged by an output of said first opamp during a second charging phase;
   a second opamp having an input that communicates with said second charging circuit during a second integrating phase; and
   a second current source that selectively generates said first bias current for said second opamp during said second charging phase and said second bias current for said second opamp during said second integrating phase.

2. The analog to digital converter of claim 1 wherein said first and second current sources comprise:
   a current source;
   a switching device that communicates with said current source, that selectively connects said current source to said first opamp as said current source is disconnected from said second opamp to provide said second bias current to said first opamp during said integrating phase of said first opamp.

3. The analog to digital converter of claim 2 wherein said current source comprises a current mirror.

4. The analog to digital converter of claim 3 wherein said switching device comprises first and second switches that communicate with said current mirror.

5. The analog to digital converter of claim 2 wherein said switching device selectively disconnects said current source from said first opamp as said current source is connected to said second opamp to provide said second bias current to said second opamp during said integrating phase of said second opamp.

6. The analog to digital converter of claim 1 wherein said first bias current is less than said second bias current.

7. The analog to digital converter of claim 1 wherein said first bias current is zero and said second bias current is greater than zero.

8. The analog to digital converter of claim 1 further comprising a first switching circuit that communicates with said input of said first opamp, said first charging circuit and said first current source, charges said first charging circuit using said input voltage and operates said first current source to supply said first bias current to said first opamp during said charging phase, and that isolates said first charging circuit from said input voltage and operates said first current source to supply said second bias current to said first opamp during said integrating phase.

9. The analog to digital converter of claim 1 wherein said first current source is a variable current source that selectively provides said first and second bias currents during said charging and integrating phases, respectively.

10. The analog to digital converter of claim 1 wherein said first current source includes two current sources, and wherein only one of said two current sources is connected to said first opamp during said integrating phase.

11. The analog to digital converter of claim 1 further comprising a second switching circuit that communicates with said input of said second opamp, said second charging circuit and said second current source, charges said second charging circuit using said output of said second opamp, and operates said second current source to supply said first bias current to said second opamp during said second charging phase, and that isolates said second charging circuit from said output of said first opamp and operates said second current source to supply said second bias current to said second opamp during said second integrating phase.

12. The analog to digital converter of claim 1 wherein said first charging circuit includes at least one capacitor.

13. The analog to digital converter of claim 1 wherein said charging phase and said second integrating phase occur at the same time and said integrating phase and said second charging phase occur at the same time.

14. A multi-stage pipelined analog to digital converter, comprising:
   a first stage including first charging circuit that samples an input voltage during a charging phase, a first opamp having an input that communicates with said first charging circuit during an integrating phase, a first current source that selectively generates a first bias current for said first opamp during said charging phase and a second bias current that is not equal to said first bias current during said integrating phase, and a first switching circuit that communicates with said input of said first opamp, said first charging circuit and said first current source, charges said first charging circuit using said input voltage, and operates said first current source to supply said first bias current to said first opamp during said charging phase, and that isolates said first charging circuit from said input voltage and operates said first current source to supply said second bias current to said first opamp during said integrating phase; and a second stage including a second charging circuit that samples an output of said first opamp during a second charging phase, a second opamp having an input that communicates with said second charging circuit during a second integrating phase, a second current source that selectively generates said first bias current for said second opamp during said second charging phase and said second bias current for said second opamp during said second integrating phase, and a second switching circuit that communicates with said input of said second opamp, said second charging circuit and said second current source, charges said second charging circuit using said output of said first opamp, and operates said second current source to supply said first bias current to said second opamp during said second charging phase, and that isolates said second charging circuit from said output of said first opamp and operates said second current source to supply said second bias current to said second opamp during said second integrating phase.

15. The analog to digital converter of claim 14 wherein said first and second current sources comprise:
a current source;
a switching device that communicates with said current source, that selectively connects said current source to said first opamp as said current source is disconnected from said second opamp to provide said second bias current to said first opamp during said integrating phase of said first opamp.

16. The analog to digital converter of claim 15 wherein said current source comprises a current mirror.

17. The analog to digital converter of claim 16 wherein said switching device comprises first and second switches that communicate with said current mirror.

18. The analog to digital converter of claim 15 wherein said switching device selectively disconnects said current source from said first opamp as said current source is connected to said second opamp to provide said second bias current to said second opamp during said integrating phase of said second opamp.

19. The multi-stage pipelined analog to digital converter of claim 14 wherein said first bias current is less than said second bias current.

20. The multi-stage pipelined analog to digital converter of claim 14 wherein said first bias current is zero and said second bias current is greater than zero.

21. The multi-stage pipelined analog to digital converter of claim 14 wherein said charging phase and said second integrating phase occur at the same time and said integrating phase and said second charging phase occur at the same time.

22. The multi-stage pipelined analog to digital converter of claim 14 wherein said first and second charging circuits include at least one capacitor.

23. An analog to digital converter, comprising:
first charging means for sampling an input voltage during a charging phase;
first integrating means for communicating with said first charging means during an integrating phase; and
first current means for selectively generating a first bias current for said first integrating means during said charging phase and a second bias current that is not equal to said first bias current during said integrating phase;
second charging means for sampling an output of said first integrating means during a second charging phase;
second integrating means for communicating with said second charging means during a second integrating phase; and
second current means for selectively generating said first bias current for said second integrating means during said second charging phase and said second bias current during said second integrating phase.

24. The analog to digital converter of claim 23 wherein said first and second current means comprise:
current means for providing current;
switching means that communicates with said current means, that selectively connects said current means to said first integrating means as said current means is disconnected from said second integrating means to provide said second bias current to said first integrating means during said integrating phase of said first integrating means.

25. The analog to digital converter of claim 24 wherein said current means comprises a current mirror.

26. The analog to digital converter of claim 25 wherein said switching means comprises first and second switches that communicate with said current mirror.

27. The analog to digital converter of claim 24 wherein said switching means selectively disconnects said current means from said first integrating means as said current source is connected to said second integrating means to provide said second bias current to said second integrating means during said integrating phase of said second integrating means.

28. The analog to digital converter of claim 23 wherein said first bias current is less than said second bias current.

29. The analog to digital converter of claim 23 wherein said first bias current is zero and said second bias current is greater than zero.

30. The analog to digital converter of claim 23 further comprising first switching means that communicates with said first integrating means, said first charging means and said first current means, for charging said first charging means using said input voltage and operating said first current means to supply said first bias current to said first integrating means during said charging phase, and for isolating said first charging means from said input voltage and operating said first current means to supply said second bias current to said first integrating means during said integrating phase.

31. The analog to digital converter of claim 23 wherein said first current means is a variable current source that selectively provides said first and second bias currents during said charging and integrating phases, respectively.

32. The analog to digital converter of claim 23 wherein said first current means includes two current sources, and wherein only one of said two current sources is connected to said first opamp during said integrating phase.

33. The analog to digital converter of claim 23 further comprising second switching means that communicates with said second integrating means, said second charging means and said second current means, for charging said second charging means using said output of said first integrating means and operating said second current means to supply said first bias current to said second integrating means during said second charging phase, and for isolating said second charging means from said output of said first integrating means and operating said second current means to supply said second bias current to said second integrating means during said second integrating phase.

34. The analog to digital converter of claim 23 wherein said first charging means includes at least one capacitor.

35. The analog to digital converter of claim 23 wherein said charging phase and said second integrating phase occur at the same time and said integrating phase and said second charging phase occur at the same time.

36. A multi-stage pipelined analog to digital converter, comprising:

a first stage including first charging means for sampling an input voltage during a charging phase, first integrating means for communicating with said first charging means during an integrating phase, first current means for selectively generating a first bias current for said first integrating means during said charging phase and a second bias current that is not equal to said first bias current during said integrating phase, and a first switching means that communicates with said first integrating means, said first charging means and said first current means, for charging said first charging means using said input voltage and operating said first current means to supply said first bias current to said first integrating means during said charging phase, and for isolating said first charging means from said input voltage and operating said first current means to supply said second bias current to said first integrating means during said integrating phase; and a second stage including second charging means for sampling an output of said first integrating means during a second charging phase, second integrating means for communicating with said second charging means during a second integrating phase, second current means for selectively generating said first bias current for said second integrating means during said second charging phase and said second bias current for said second integrating means during said second integrating phase, and second switching means that communicates with said input of said second integrating means, said second charging means and said second current means, for charging said second charging means using said output of said first integrating means and operating said second current means to supply said first bias current to said second integrating means during said second charging phase; and for isolating said second charging means from said output of said first integrating means and operating said second current means to supply said second bias current to said second integrating means during said second integrating phase.

37. The analog to digital converter of claim 36 wherein said first and second current means comprise:

current means for providing current;

switching means that communicates with said current means, that selectively connects said current means to said first integrating means as said current means is disconnected from said second integrating means to provide said second bias current to said first integrating means during said integrating phase of said first integrating means.

38. The analog to digital converter of claim 37 wherein said current means comprises a current mirror.

39. The analog to digital converter of claim 38 wherein said switching means comprises first and second switches that communicate with said current mirror.

40. The analog to digital converter of claim 37 wherein said switching means selectively disconnects said current means from said first integrating means as said current source is connected to said second integrating means to provide said second bias current to said second integrating means during said integrating phase of said second integrating means.

41. The multi-stage pipelined analog to digital converter of claim 36 wherein said first bias current is less than said second bias current.

42. The multi-stage pipelined analog to digital converter of claim 36 wherein said first bias current is zero and said second bias current is greater than zero.

43. The multi-stage pipelined analog to digital converter of claim 36 wherein said charging phase and said second integrating phase occur at the same time and said integrating phase and said second charging phase occur at the same time.

44. The multi-stage pipelined analog to digital converter of claim 36 wherein said first and second charging means include at least one capacitor.

45. A method for operating an analog to digital converter, comprising:

storing an input voltage during a charging phase;

integrating said stored input voltage during an integrating phase using an opamp; and selectively generating a first bias current for said opamp during said charging phase and a second bias current that is not equal to said first bias current during said integrating phase;

storing an output of said first opamp during a second charging phase;

integrating said stored output of said first opamp during a second integrating phase; and selectively generating said first bias current for said second opamp during said second charging phase and said second bias current for said second opamp during said second integrating phase.

46. The method of claim 45 further comprising selectively connecting a current source to a first opamp as said current source is disconnected from a second opamp to provide said second bias current to said first opamp during said integrating phase of said first opamp.

47. The method of claim 46 further comprising selectively disconnecting said current source from said first opamp as said current source is connected to said second opamp to provide said second bias current to said second opamp during said integrating phase of said second opamp.

48. The method of claim 46 wherein said current source comprises a current mirror.

49. The method of claim 45 wherein said first bias current is less than said second bias current.

50. The method of claim 45 wherein said first bias current is zero and said second bias current is greater than zero.

51. The method of claim 45 wherein said first and second bias currents are supplied by a variable current source during said charging and integrating phases, respectively.

52. The method of claim 45 wherein an output of one of two current sources is connected to said first opamp during said integrating phase.

53. The method of claim 45 wherein said charging phase and said second integrating phase occur at the same time and said integrating phase and said second charging phase occur at the same time.

* * * * *